United States Patent [19]

Hong et al.

[11] Patent Number: 5,936,994
[45] Date of Patent: Aug. 10, 1999

[54] TWO-SECTION COMPLEX COUPLED DISTRIBUTED FEEDBACK SEMICONDUCTOR LASER WITH ENHANCED WAVELENGTH TUNING RANGE

[75] Inventors: Jin Hong, Nepean; Hyung B. Kim, Kanata; Toshi Makino, Nepean, all of Canada

[73] Assignee: Northern Telecom Limited, Montreal, Canada

[21] Appl. No.: 08/933,529

[22] Filed: Sep. 18, 1997

[51] Int. Cl.⁶ .................................. H01S 3/08; H01S 3/10
[52] U.S. Cl. .................................. 372/96; 372/50; 372/33; 372/102; 372/45; 372/46; 372/20
[58] Field of Search .................................. 372/96, 50, 33, 372/102, 45, 46, 20

[56] References Cited

U.S. PATENT DOCUMENTS

| 5,119,393 | 6/1992 | Oka et al. | 372/50 |
| 5,289,494 | 2/1994 | Tada et al. | 372/96 |

OTHER PUBLICATIONS

Y. Luo, Y. Nakano, K. Tada et al. Purely gain–coupled distributed feedback (Apr.) (has been considered)–Jan. 28, 1999.

G.P. Li, T. Makino, R. Moore et al. "Partly gain–coupled 1.55 μm strained layer multiquantum well DFB lasers", IEEE J. Quantum Electronics, vol. QE–29, pp. 1736–1742, (Jun.) 1993.

B. Borchert, K. David, B. Stegmuller et al. "1.55 μm gain–coupled quantum–well distributed feedback lasers with high–single–mode yield and narrow linewidth", IEEE Photon. Technol. Lett., vol. 3, No. 11, pp. 955–957, Nov. 1991.

H. Kogelnik and C.V. Shank "Coupled–Wave theory of distributed feedback lasers", J. Appl. Phys., vol. 43, No. 5, pp. 2327–2335, (May) 1972.

W.T. Tsang, F.S. Choa, M.C. Wu et al. "Semiconductor distributed feedback lasers with quantum well superlattice gratings for index or gain–coupled feedback", Appl. Phys. Lett., vol. 60, pp. 2580–2582, (May) 1992.

M. Okai, I.F. Lealman, L.J. Rivers et al. "In–line Fabry–Perot optical waveguide filter with quasi–chirped gratings", Electron Lett., vol. 32, pp. 108–109, (Jan.)1996.

J. Hong, K. Leong, T Makino et al. "Impact of random facet phase on modal properties of partly gain–coupled DFB lasers", J. Selected Topics on Quantum Electronics, vol. 3, No. 2, pp. 555–568, (Apr.) 1997.

Y. Yoshikuni, K. Oe, G. Motosugi, T. Matsuoka "Broad Wavelength tuning under single–mode oscillation with a multi–electrode distributed feedback laser", Electronic Lett., vol. 22, No. 22, pp. 1153–1154. (Oct.) 1986.

(List continued on next page.)

*Primary Examiner*—Rodney Bovernick
*Assistant Examiner*—Sung T. Kim
*Attorney, Agent, or Firm*—Angela de Wilton; Victoria Donnelly

[57] ABSTRACT

A complex coupled (gain coupled or loss coupled) distributed feedback (DFB) semiconductor laser, having two sections axially distinct along a cavity length direction, and two excitation means for independent pumping of corresponding sections of the laser in a master and slave type of pumping control, is provided. An extended continuous wavelength tuning range of the laser is obtained by selectively activating a left Bragg mode or a right Bragg mode across the stop band of the laser as a dominant lasing mode by the master and slave type of current injection control into different sections of the laser to alternate gain coupling and loss coupling mechanisms of laser operation, and further tuning a wavelength around the activated Bragg mode. Methods of operating the laser, enhancing a tuning range, and fabricating thereof are provided.

42 Claims, 5 Drawing Sheets

OTHER PUBLICATIONS

I. Kim, R.C. Alferness, U. Koren et al. "Broadly tunable vertical–coupler filtered tensile–strained InGaAs/InGaAsP multiple quantum well laser", Appl. Phys. Lett., vol. 64, pp. 2764–2766, (May) 1994.

M. Oberg, S. Nilsson, K. Streubel et al. "74 nm wavelength tuning range of an InGaAsP/InP vertical grating–assisted codirectional coupler laser with rear sampled grating reflector", IEEE Photonics Technol. Lett., vol. 5, pp. 735–737, (Jul.) 1993.

H. Ishii, Y. Tohmori, Y. Yoshikuni et al. "Multiple–phase–shift super structure grating DBR lasers for broad wavelength tuning", IEEE Photonics Technol. Lett., vol. 5, pp. 613–615, (Jun.) 1993.

TWO-SECTION COMPLEX COUPLED DISTRIBUTED FEEDBACK SEMICONDUCTOR LASER WITH ENHANCED WAVELENGTH TUNING RANGE

FIELD OF THE INVENTION

The invention relates to semiconductor lasers, and in particular, to complex coupled distributed feedback (DFB) semiconductor lasers with enhanced continuous wavelength tuning range, and methods of operating and fabricating such lasers.

BACKGROUND OF THE INVENTION

Fiber optics communication systems require compact light emitting sources capable of generating single-mode, tunable, narrow linewidth radiation in the 1.3–1.56 $\mu$m wavelength range. Some of the existing semiconductor lasers, for example, InGaAsP DFB lasers can meet requirements for high power and proper wavelength, but a high dynamic single mode yield is difficult to achieve. Conventional index coupled CFB lasers employing an index corrugation have an inherent problem in existence of two longitudinal modes with an equal threshold gain which results in poor single mode operation as shown, for example, in the article by H. Kogelnik and C. V. Shank "Coupled-Wave theory of distributed feedback lasers", J. Appl. Phys., vol. 43, no. 5, pp. 2327–2335, 1972. In complex coupled DFB lasers, a periodic optical gain or loss modulation in the presence or absence of conventional index corrugation along the laser cavity effectively breaks the mode degeneracy between the two Bragg modes around the stop band of the DFB lasers, and thus avoids a serious and inherent problem for conventional index coupled DFB lasers, as shown in publications by Y. Luo, Y. Nakano, K. Tada et al. "Purely gain-coupled distributed feedback semiconductor 35 lasers", Appl. Phys. Lett., vol. 56, pp. 1620–1622, 1990 and G. P. Li, T. Makino, R. Moore et al. "Partly gain-coupled 1.55 $\mu$m strained layer multi-quantum well DFB lasers", IEEE J. Quantum Electronics, vol. QE-29, pp. 1736–1742, 1993. With introduction of even a small amount of gain or loss coupling, the dynamic single mode yield of complex coupled DFB lasers increases drastically, whether or not there is index coupling. It effectively provides lasing predominantly on a preferred and fixed Bragg mode among the two originally degenerate ones around a stop band, regardless of random distribution of unknown laser facet phases. In in-phase gain coupled DFB lasers, the higher index region within a grating period has a higher optical modal gain, resulting in lasing mainly of the right Bragg mode with the lasing wavelength longer than the Bragg wavelength. Both theory and experiments have confirmed this conclusion. For anti-phase loss coupled DFB lasers, the higher index region within a grating period experiences higher optical loss, resulting primarily in lasing of the left Bragg mode with the lasing wavelength shorter than the Bragg wavelength.

Previously known gain coupled or loss coupled DFB lasers utilize only one type of complex coupling which results in a high dynamic single mode yield for one of predetermined and dominant Bragg mode only. The random distribution of cleaved or HR-coated laser facets is usually the major reason why the opposite Bragg mode across the stop band sometimes actually lases as the dominant mode. Nevertheless, with an increase of complex coupling strength, the single mode yield increases quickly, and an excellent dynamic single mode behavior with a high side mode suppression ratio (SMSR) can be obtained, as reported in the publication by B. Borchert, K. David, B. Stegmuller et al. "1.55 $\mu$m gain-coupled quantum-well distributed feedback lasers with high-single-mode yield and narrow linewidth", IEEE Photon. Technol. Lett., vol. 3, no. 11, pp. 955–957, 1991.

Complex coupled DFB lasers have been studied intensively by different scientific groups. It was shown that they constitute a good candidate for practical applications in fiber optics communication systems. Some of the achievements are reported in the following publications: W. T. Tsang, F. S. Choa, M. C. Wu et al. "Semiconductor distributed feedback lasers with quantum well superlattice gratings for index or gain-coupled feedback", Appl. Phys. Lett., vol. 60, pp. 2580–2582, 1992 and J. Hong, K. Leong, T Makino et al. "Impact of random facet phase on modal properties of partly gain-coupled DFB lasers", J. Selected Topics on Quantum Electronics, vol. 3, no. 2, pp. 555–568, 1997.

Nevertheless, a rapid advance in high speed and large capacity dense wavelength division multiplexing (DWDM) fiber optics systems has been constantly demanding semiconductor lasers having not only single mode properties but also a wide continuous tuning range for practical and cost effective applications. A number of techniques have been used in attempt to obtain a widely tunable DFB laser with dynamic single mode performance comparable with standard DFB laser generating at fixed wavelength. First, conventional index coupled tunable lasers followed by complex coupled lasers were tried. The latter appeared to be better in comparison with index coupled lasers because of maintaining good single mode properties within a wide wavelength tuning range. However, similar to other single contact DFB lasers, a wavelength range of complex coupled DFB lasers is limited either by the injection current or base temperature. A multi-sectional laser with separate electrodes for independent current injection was introduced next, providing an effective mode selection and phase control. Some of the experimental implementations of the idea are described in the following publications: Y. Yoshikuni, K. Oe, G. Motosugi, T. Matsuoka "Broad Wavelength tuning under single-mode oscillation with a multi-electrode distributed feedback laser", Electronic Lett., vol. 22, no. 22, pp. 1153–1154; I. Kim, R. C. Alferness, U. Koren et al. "Broadly tunable vertical-coupler filtered tensile-strained InGaAs/InGaAsP multiple quantum well laser", Appl. Phys. Lett., vol. 64, pp. 2764–2766, 1994; M. Oberg, S. Nilsson, K. Streubel et al. "74 nm wavelength tuning range of an InGaAsP/In vertical grating-assisted codirectional coupler laser with rear sampled grating reflector", IEEE Photonics Technol. Lett., vol. 5, pp. 735–737, 1993; H. Ishii, Y. Tohmori, Y. Yoshikuni et al. "Multiple-phase-shift super structure grating DBR lasers for broad wavelength tuning", IEEE Photonics Technol. Lett., vol. 5, pp. 613–615, 1993; M. Okai, I. F. Lealman, L. J. Rivers et al. "In-line Fabry-Perot optical waveguide filter with quasi-chirped gratings", Electron. Lett., vol. 32, pp. 108–109, 1996. When conventional index coupled DFB lasers are used in conjunction with multi-electrodes to achieve wider wavelength tuning range, current injection into two different electrodes of DFB lasers has to be well controlled and the current ratio among the electrodes needs to be precisely maintained. Due to the inherent Bragg mode degeneracy in conventional index coupled DFB lasers, each DFB section has its own stop band. The two Bragg modes around the related stop band compete equally for lasing as the dominant mode. Which one of the Bragg modes will tend to lase depends largely on the unknown grating facet phase and the injection currents in the two different sections. When two sections of the laser are biased independently, two pairs of Bragg modes, four in total, tend to compete against each other. Normally it results in a low SMSR or fast degradation of SMSR during the wavelength tuning within a certain current injection range. To overcome these problems, a complicated and tedious injection current control is normally required. As a result, a high yield device with a high SMSR, wide controlled tuning range and long term stable operation is difficult to obtain. Moreover, from device to device, the random facet phase usually causes a random distribution of lasing mode between the two pairs of degenerated Bragg modes, and the final single mode yield with a wide wavelength tuning range is low. Even if a preselected SMSR is initially high, it can degrade rapidly with a small injection current variation within a certain range due to the sensitivity of index coupled DFB lasers to initial phase variations.

Among other multi-sectional lasers, complex coupled lasers appear to be the best candidates for a wide range tuning. Complex coupled DFB lasers are preferably used as building blocks for tunable lasers to ensure a high SMSR and provide high single mode yield and a small degradation of SMSR over injection current variation. Nevertheless, the tuning range of these lasers is still limited which results in a continued demand for further increasing a tuning range of DFB lasers while maintaining other essential characteristics of the lasers, and development of effective methods of their operation.

SUMMARY OF THE INVENTION

Thus, the present invention seeks to provide a distributed feedback complex coupled semiconductor laser with enhanced continuous tuning range, and methods of operating and fabricating thereof.

Thus, according to one aspect of the present invention there is provided a distributed feedback single mode complex coupled semiconductor laser device, comprising:

a substrate;

an active region formed thereon;

a complex coupled grating structure having corrugations along a cavity length direction;

a first and a second excitation means for an independent pumping of first and second sections of the laser axially distinct along a cavity length direction;

the laser device being characterized by means for varying the pumping of the first section of the laser with respect to the pumping of the second section of the laser in a master and slave type of pumping control for controllably activating a left Bragg mode or a right Bragg mode across the laser stop band by alternating use of anti-phase loss coupling or in-phase gain coupling mechanisms of laser operation.

Thus, a two-section semiconductor laser device using a master and slave type of pumping control is provided. The left Bragg mode is activated by pumping the first section above a threshold level, the second section being unpumped or pumped in reverse, a loss coupling mechanism of laser operation being provided. The right Bragg mode is activated by pumping the first section above a transparency level and the second section above a threshold level, a gain coupling mechanism of laser operation being provided. Thus, by activating loss or gain coupling mechanisms an effective switching between two Bragg modes across a laser stop band is achieved. Additionally, by introducing means for tuning laser wavelength around the left and the right Bragg modes, a DFB laser with enhanced tuning wavelength range is provided. Advantageously the tuning range extends across a whole range of left and right Bragg modes.

Beneficially, the active region of the laser comprises a multiple quantum well structure.

A complex coupled grating structure comprises a uniform or chirped grating, having one or two grating sections, positionally corresponding to the first and the second sections of the laser. Two grating sections may have the same or different corrugation periods. Beneficially the grating structure is patterned by periodic etching grooves through the active region. Alternatively it may be formed in the layer adjacent to the active region by holographic exposure.

First and second excitation means for an independent pumping of first and second sections of the laser comprises electrical contacts for current injection into the active region. Alternatively, the semiconductor laser device may be capable of coupling to an external optical pumping source to create a population inversion. Beneficially, a first and second electrode for pumping of first and second sections of the laser are formed on a top of the current confining region of the laser. The current confining region is preferably a ridge waveguide or a buried hetero-structure.

According to another aspect of the invention there is provided a distributed feedback single mode complex coupled semiconductor laser device, comprising:

a substrate;

a bottom electrode formed on a bottom surface of the substrate;

an active region formed on the substrate, comprising a multiple quantum well structure;

a complex coupling grating formed by periodic etching grooves through the active region along a cavity length direction;

a current confining ridge on the active region, and a first electrode and a second electrode, formed on a top of the current confining ridge for independent current injection into a first section and a second section of the laser axially distinct along a cavity length direction, the laser device being characterized by means for varying the current injection through the first electrode with respect to the current injection through the second electrode in a master and slave type of current injection control for controllably activating a left Bragg mode or a right Bragg mode across the laser stop band by alternating use of anti-phase loss coupling or in-phase gain coupling mechanisms of laser operation, and tuning the lasing wavelength around the left Bragg mode and the right Bragg mode by varying the correspondent current injection.

The left Bragg mode is activated by biasing the first section of the laser above a threshold level, the second section of the laser being unbiased, biased in reverse or below a transparency level, the loss coupling mechanism of laser operation being provided. The right Bragg mode is activated by biasing the first section of the laser above a transparency level and the second section above a threshold level, the gain coupling mechanism of laser operation being provided.

The grating structure has grooves whose depth is equal to or less than a thickness of the active region. Preferably, it is a first order uniform grating. Alternatively, the grating may be a chirped grating.

By corresponding selection of semiconductor materials and type of doping, for substrate and current confining ridge, the laser is adjusted to generate light within certain wavelength ranges. Preferably they are 1.3–1.56 $\mu$m and 0.8–0.9

μm for InP and GaAs alloys utilized as substrate materials correspondingly.

According to another aspect of the present invention there is provided a method of operating a distributed feedback complex coupled semiconductor laser device, having a first excitation means and a second excitation means for an independent pumping of a first section and a second section of the laser axially distinct along a cavity length direction, the method comprising:

varying the pumping of the first section of the laser with respect to the pumping of the second section of the laser in a master and slave type of pumping control for controllably activating a left Bragg mode or a right Bragg mode across the laser stop band by alternating use of anti-phase loss coupling or in-phase gain coupling mechanisms of laser operation.

Additionally the method comprises a step for tuning the laser wavelength around the left and the right Bragg modes correspondingly.

Fast varying of the pumping of two sections of the laser, usually within a time interval of several nanoseconds, provides fast switching between the left and the right Bragg modes. Additional periodic modulation of the left Bragg mode and the right Bragg mode when the corresponding mode is activated, and separation of them by optical filtering techniques provides two wavelength modulation at the same time.

According to another aspect of the present invention there is provided a method of enhancing a tuning range in a distributed feedback complex coupled semiconductor laser device, having a first electrode and a second electrode for independent current injection into a first section and a second section of the laser axially distinct along a cavity length direction, the method comprising:

varying the current injection through the first electrode with respect to the current injection through the second electrode in a master and slave type of current injection control for controllably activating a left Bragg mode or a right Bragg mode across the laser stop band by alternating use of anti-phase loss coupling or in-phase gain coupling mechanisms of laser operation; and tuning the laser wavelength around the left and the right Bragg modes by varying the corresponding current injection.

According to another aspect of the invention there is provided a method of fabricating a distributed feedback single mode complex coupled semiconductor laser device, comprising the steps of:

providing a substrate;

forming an active region thereon;

forming a complex coupled grating structure having corrugations along a cavity length direction;

providing a first excitation means and a second excitation means for an independent pumping of a first section and a second section of the laser axially distinct along a cavity length direction;

providing means for varying pumping of the first section of the laser with respect to the pumping of the second section of the laser in a master and slave type of control for controllably activating left or right Bragg modes across the laser stop band by alternating use of anti-phase loss coupling or in-phase gain coupling mechanisms of laser operation;

providing means for tuning the laser wavelength around the left and the right Bragg modes correspondingly.

According to yet another aspect of the present invention there is provided a method of fabricating a distributed feedback single mode complex coupled semiconductor laser device, comprising:

providing a semiconductor substrate;

forming a bottom electrode on a bottom surface of the substrate;

forming an active region on the substrate comprising a multiple quantum well structure;

forming a complex coupled grating formed by periodic etching grooves through said active region along a cavity length direction;

forming a current confining ridge on the active region;

forming a first electrode and a second electrode on a top of the current confining ridge for an independent current injection into a first section and a second section of the laser axially distinct along a cavity length direction;

providing means for varying the current injection through the first electrode with respect to the current injection through the second electrode in a master and slave type of current injection control for controllably activating a left or right Bragg mode across the laser stop band by alternating use of anti-phase loss coupling or in-phase gain coupling mechanisms of laser operation;

providing means for tuning the laser wavelength around the left Bragg mode and the right Bragg mode correspondingly.

Thus, a two-section DFB semiconductor laser device with enhanced continuous tuning range and excellent single mode performance, and methods of operating and fabricating thereof is provided.

BRIEF DESCRIPTION OF THE DRAWINGS

The invention will now be described in greater detail with reference to the attached drawings, in which:

FIG. 8 is a combined wavelength tuning plot for the DFB laser according to the first embodiment of the invention;

FIG. 9 is a dependence of a side mode suppression ratio on the injection current for the DFB laser according to the first embodiment of the invention;

FIG. 10 is a bit error rate plot as a function of the received optical power for the DFB laser according to the first embodiment of the invention.

DESCRIPTION OF THE PREFERRED EMBODIMENTS

Structure

Figure 1:
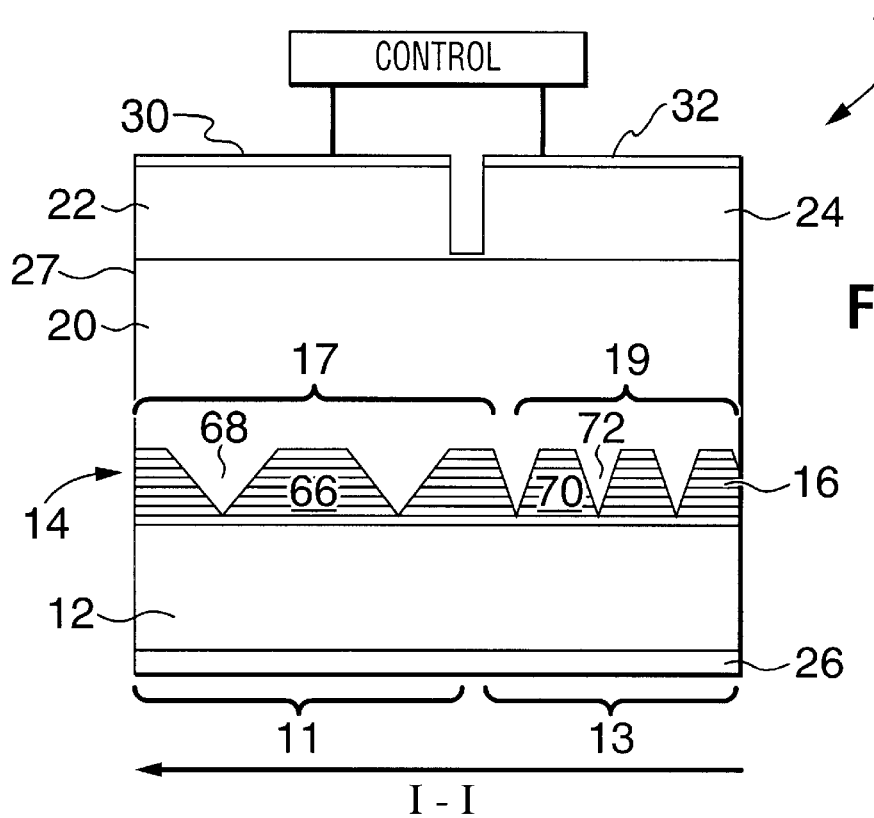
FIG. 1 is a schematic cross-sectional view of the DFB laser according to the first embodiment of the invention.

A schematic cross section through a distributed feedback single mode complex coupled laser device 10 according to a first embodiment of the present invention is shown in FIG. 1. The device 10 comprises a substrate 12 providing a first confinement region, and active region 14 comprising a multiple quantum well structure 16 and a grating structure 18 defined therein, and an overlying confinement region 20. Means for excitation of the laser device are formed thereon, and include a contact to the substrate, and a first and second current confining ridges 22 and 24 defining first and second sections 26 and 28 of the laser axially distinct along a cavity length direction, first and second contact electrodes 30 and 32 being defined on each ridge respectively for current injection into the device structure. The dual control electrode structure provides for operation of the first and second sections of the laser in a master and slave type control which will be described in detail below.

Figure 2:
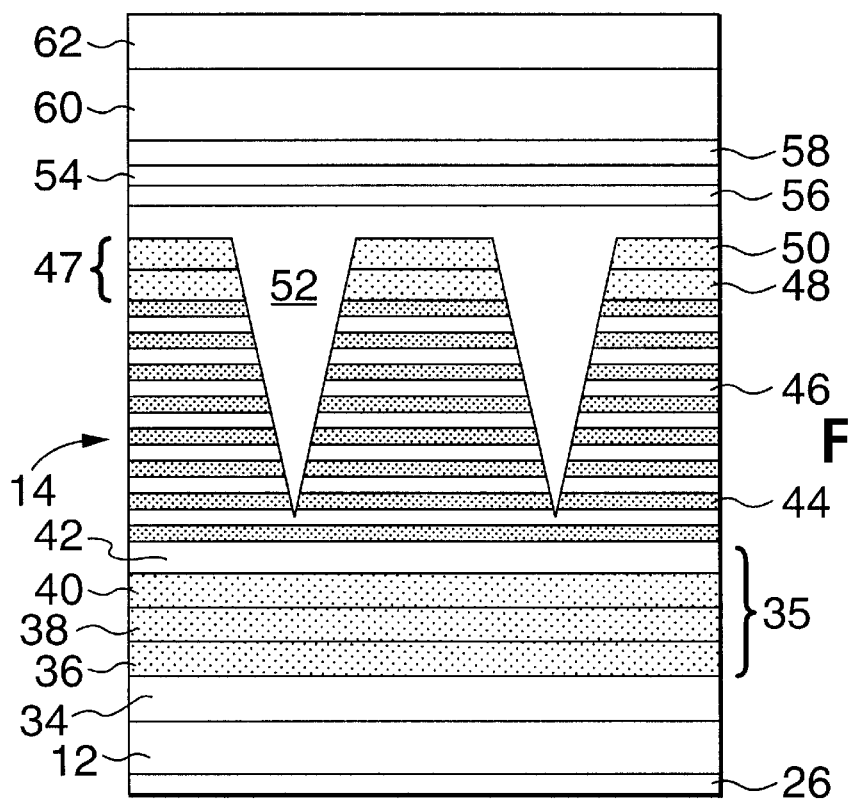
FIG. 2 is a detailed cross-sectional view of the DFB laser according to the first embodiment of the invention.
Figure 3:
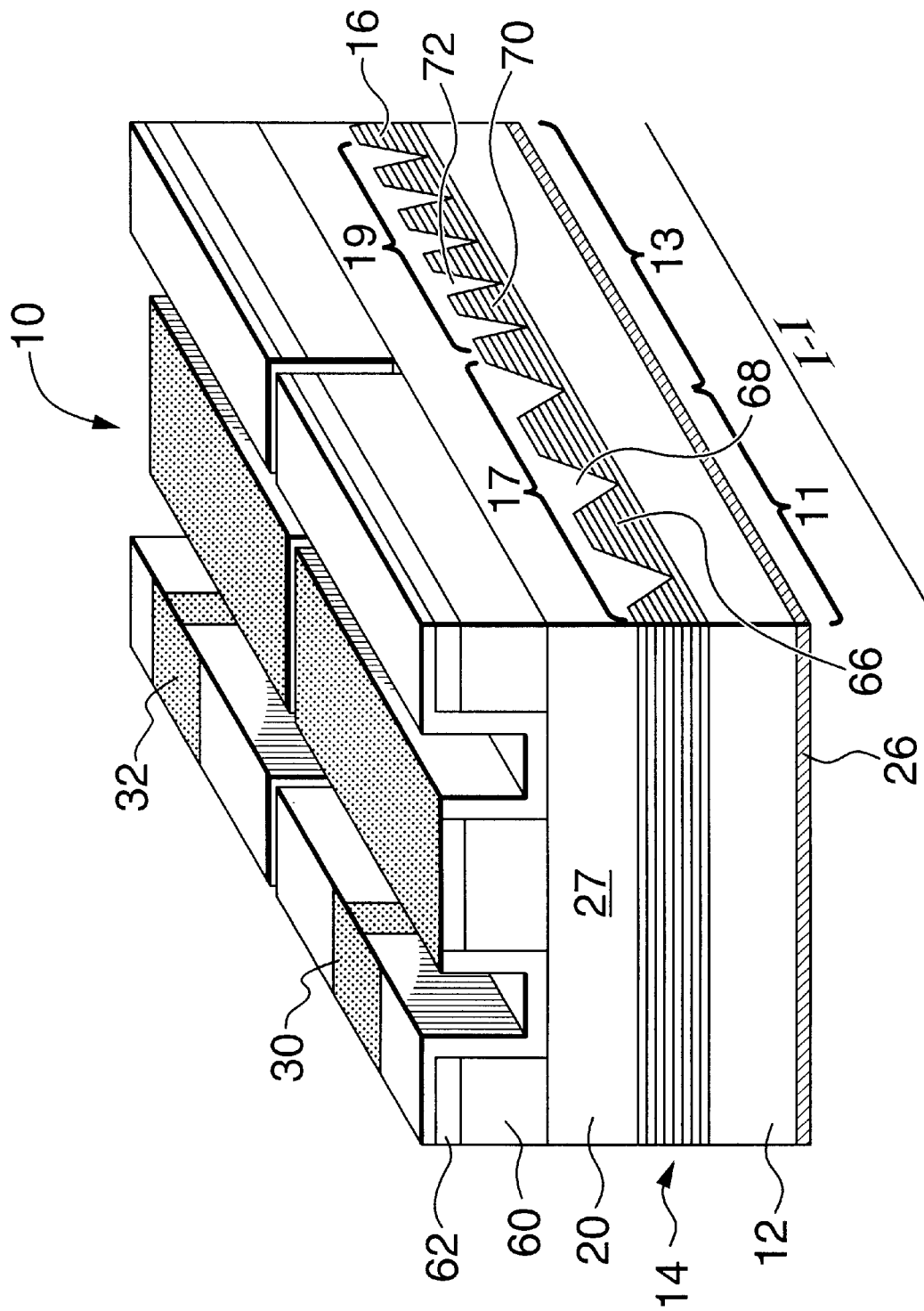
FIG. 3 is a perspective view of the DFB semiconductor laser according to the first embodiment of the invention.

The structure is shown in more detail in FIG. 2, which shows a oblique cross--sectional view through the laser device structure 10, and FIG. 3 which shows a perspective view of the laser device 10. A DFB semiconductor laser device 10 is fabricated from Group III–V semiconductor materials, and comprises a heavily P-doped InP substrate 12, on which an P-doped InP buffer layer 34 of 1.5 $\mu$m thickness is defined. The first separate confinement region 35, consisting of four confinement layers 36, 38, 40 and 42 of P-doped InGaAsP with energy band gaps corresponding to wavelengths of 1.0 $\mu$m, 1.1 $\mu$m, 1.2 $\mu$m and 1.25 $\mu$m respectively, is provided over the buffer layer 34. The thickness of each confinement layer is 20 nm, and the confinement layer 36 corresponding to the 1.0 $\mu$m wavelength is adjacent to the buffer layer 34. The active region 14 overlies the confinement region 35 and comprises a multiple quantum well (MQW) structure 16 which includes eight 1% compressively strained P-doped InGaAsP quantum wells 44, each being 5 nm thick, separated by seven P-doped InGaAsP unstrained barriers 46 with a band gap corresponding to wavelength of 1.25 $\mu$m, each barrier being 10 nm thick. The alloy composition and layer thickness of the MQW structure 16 are tailored to have specific band gap energies to provide for lasing at a required wavelength. Increasing the number of quantum wells provides higher gain per unit length of the laser cavity. The band gap of the quantum well structure described above provides a lasing wavelength of the device al about 1.55 $\mu$m. A second separate confinement region 47, consisting of two P-doped InGaAsP confinement layers 48 and 50, having energy band gaps corresponding to 1.2 $\mu$m and 1.25 $\mu$m wavelengths respectively, is grown on top of the MQW active region 14, each layer being 20 nm thick.

A grating structure 18 is defined by periodically etched grooves through the active region 14 as will be described in more detail below. The pitch of the groove is selected so as to define a first order grating for the lasing wavelength.

A P-doped InP layer 52, having a band gap wavelength smaller than the quantum well band gap wavelength, fills the grooves. A 3 nm thick etch stop layer 54 of P-doped InGaAsP, surrounded by P-doped InP buffer layer 56 at the bottom and P-doped InP buffer layer 58 at the top is formed next, the buffer layers being 100 nm and 200 nm thick correspondingly. An upper cladding layer 60 of P-type InP, followed by a highly doped P-type capping layer 62 of InGaAs for contact enhancement, having thickness 1600 nm and 200 nm correspondingly, complete the structure. A length of the first section 26 of the laser is equal to or less than a length the second section 28 of the laser, each section being reasonably long so that each of them can be viewed as an independent DFB laser, at least capable of lasing at a low threshold current in the absence of the other DFB laser attached along a laser cavity direction. The separation between the adjacent electrodes 30 and 32 is in the range of 5 to 15 $\mu$m to ensure both a sufficient electrical isolation between the adjacent electrodes and a limited material absorption loss. A bottom electrical N-contact 64 is provided at the bottom of the substrate 12. Corresponding means (not shown) for controllably varying current injection and changing a temperature of each section of the laser for switching between two Bragg modes within a stop band and tuning a laser wavelength around the left Bragg mode and the right Bragg mode correspondingly are provided.

Thus, a DFB semiconductor laser, having a first section 26 and a second section 28 of the laser, axially distinct along a cavity length direction, with a first electrode 30 and a second electrode 32 for an independent current injection into the corresponding section of the laser, and the grating structure 18 under each of the electrodes is provided.

While the laser device described above is fabricated on a N-type substrate wafer, alternatively, a complimentary structure may be fabricated on a P-type wafer.

The substrate 12 on which the laser device 10 described above is fabricated is made of InP material which results in generating a laser light within a range of 1.3–1.56 $\mu$m, corresponding to a transparency window of this material. In modifications of this embodiment, the substrate may be made of GaAs material, having a window of transparency in a shorter wavelength range of 0.8–0.9 $\mu$m, which results in generating light in this wavelength range. More precise calculation of a lasing wavelength depends also on the properties of the active region and the grating structure. In the laser cavity direction, for lasing to occur, the grating period is determined by an integer multiple of $\mu/2n$ where $\lambda$ is; very close to the desired lasing wavelength, (typically within several nm), and n is the refractive index of the material, usually in a range of 3–4 for semiconductor materials.

Figure 4:
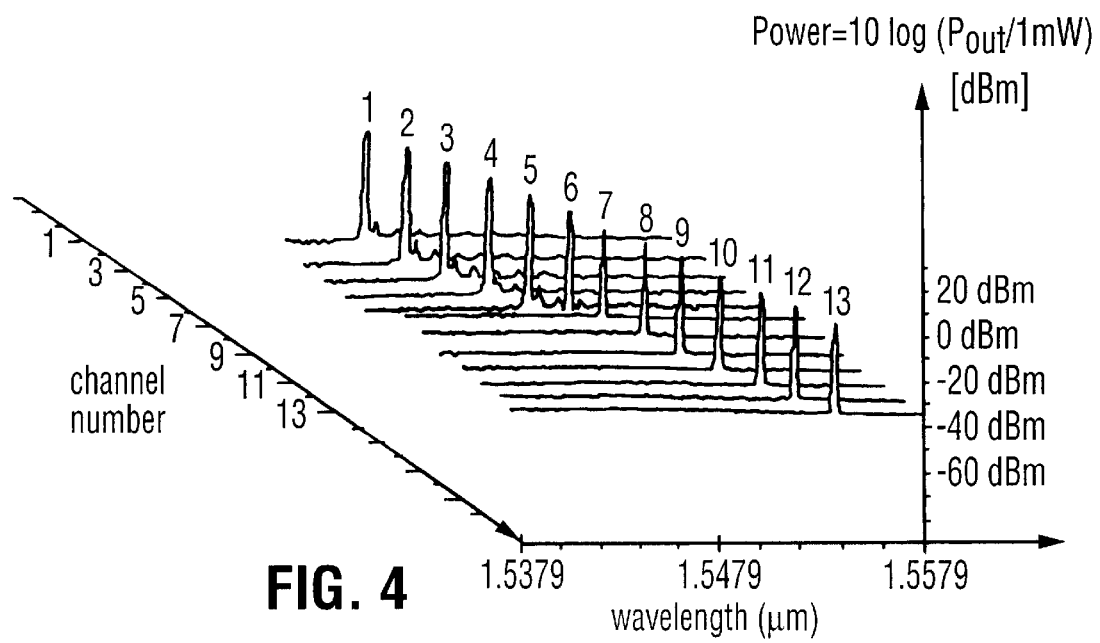
FIG. 4 is a schematic cross-sectional view of the DFB laser according to the second embodiment of the invention.

A semiconductor laser 100 according to a second embodiment is shown in FIG. 4. It comprises a substrate 112 providing a first confinement region, an active region 114 comprising a multiple quantum well structure 116, a grating structure 118, comprising two sections 117 and 119 defined therein, and an overlying confinement region 120. Means for excitation the laser device are formed thereon, and include a contact 164 to the substrate 112, and first and second confining ridges 122 and 124, defining first and second sections 126 and 128 of the laser axially distinct along a cavity length direction of the laser device 100, first and second contact electrodes 130 and 132 being defined on each ridge respectfully for current injection into the device structure. Two grating sections 117 and 119 positionally correspond to the first and second sections of the laser 126 and 128 respectively. Optionally a small spatial separation between grating sections 117 and 119 along a direction of travel of light may be provided, usually within a range of several micrometers. Grating sections 117 and 119 may have the same or different uniform corrugation periods, one or both of the grating sections 117 and 119 may also be a chirped grating. Beneficially both grating sections 117 and 119 are made by periodic etching grooves through the active region, the depth of etching being varied from etching through several top layers of the MQW only to the deep etching grooves though all layers of the MQW structure. Variation of the ridge width, corresponding to the grating sections 117 and 119, may also be made to produce an effective shift in the grating period. To ensure a continuous laser tuning within a certain wavelength range, periods of two grating sections 117 and 119 need to differ so as to provide a predetermined center Bragg wavelength separation of the grating sections 117 and 119, usually within a range of several nanometers to several tens of nanometers.

Figure 5:
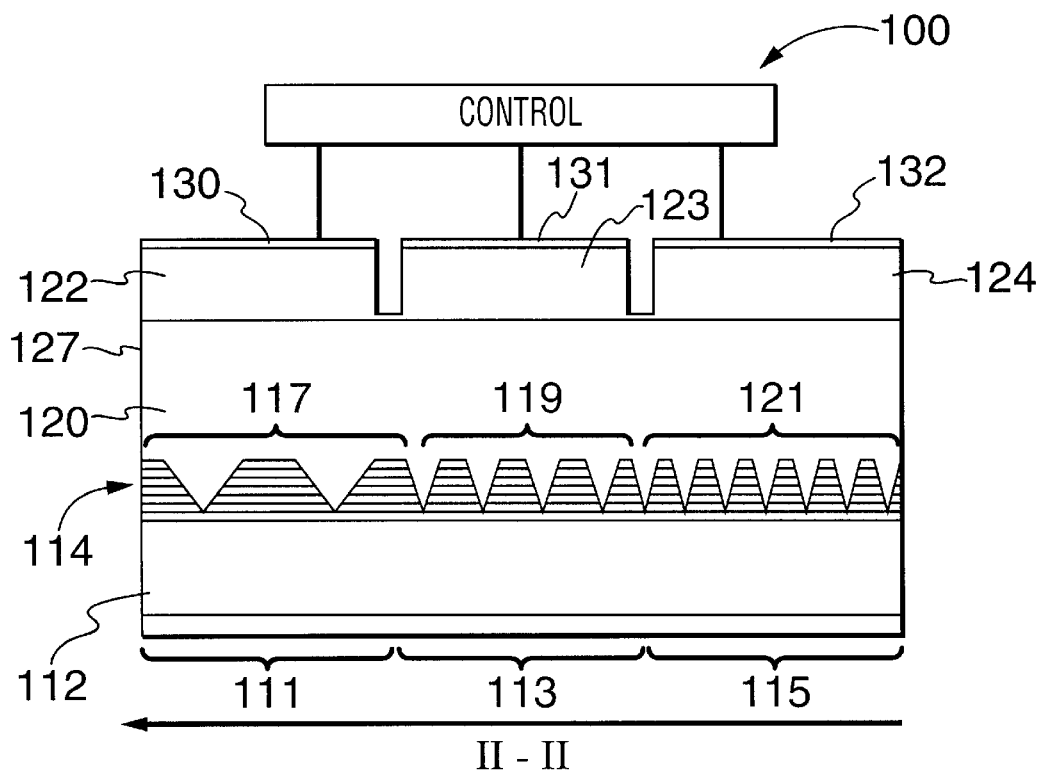
FIG. 5 is a schematic cross-sectional view of the DFB laser according to the third embodiment of the invention.

The semiconductor laser of the embodiments described above are semiconductor diode laser structures, i.e., have contacts 30 and 32 for electrical excitation of the active region by current injection. It is also contemplated that a semiconductor laser device 200 of yet another embodiment, shown in FIG. 5, may be provided with optical pumping means 230 and 232, replacing corresponding electrical contacts 30 and 32 of the first embodiment, e.g., by providing population inversion with suitable optical coupling to a another light source on the substrate. The laser 200 according to this embodiment comprises a first excitation means 230 and a second excitation means 232 for an independent pumping of the first 226 and second 228 sections of the laser axially distinct along a cavity length direction, means for varying the pumping of the first section of the laser with respect to the pumping of the second section of the laser in a master and slave type of pumping control (not shown), and means for tuning a laser wavelength around the left and the right Bragg modes correspondingly (not shown). The rest of the structure of the laser device 200 is similar to that of the previous embodiments described above. It comprises a substrate 212 providing a first separate confinement region, an active region 214 comprising a MQW structure 216 and a grating structure 218 defined therein, and an overlying confinement region 220. First and second confining ridges 222 and 224 define first and second sections of the laser 226 and 228 axially distinct along a cavity length direction. The grating structure 218 may comprise one grating as described in the first embodiment or two section grating structure as described in the second embodiment, the grating structure 218 being uniform or chirped.

In the embodiments described above the semiconductor laser is a ridge waveguide laser device. It is also contemplated that a semiconductor laser device in alternative embodiments may be a buried heterostructure device. A buried heterostructure laser may also comprise two section grating structure mentioned above, the grating structure being uniform or chirped.

Operation

Principles of operation, demonstrated on a partly complex coupled DFB laser 10 of the first embodiment of the invention, are as follows. The active MQW region 14 will become lossy if it is not electrically pumped beyond the material transparency carrier density. The more quantum wells there are within one part of the grating period, the more optical loss the mode will experience when passing through that part of grating period. In the partly gain coupled DFB laser structure, the active quantum wells are periodically etched away to form an in-phase gain coupling. When the entire active MQW region 14 is left unpumped or pumped only below the transparency level, within one grating period the grating part with has higher number of quantum wells will experience higher optical loss, and that one with lower number of quantum wells will experience lower optical loss. Since the grating part that has more quantum wells has a higher refractive index, it will correspond to the longer wavelength side of stop band (right Bragg mode). Therefore, the right Bragg mode will experience more loss than the left Bragg mode in the DFB section that are either pumped under material transparency level or left unpumped. Therefore, the underpumped section of two section complex coupled DFB laser will act as a wavelength selective filter that prefers to lase at the left Bragg mode, i.e., at the short wavelength side of the stop band. When the first section 26 of the DFB laser is pumped above the transparency level, and the second section 28 is pumped above a threshold level, an in-phase gain coupled DFB laser is formed, and the laser will predominantly lase on the longer wavelength side of the stop band (right Bragg mode).

Figure 6A:
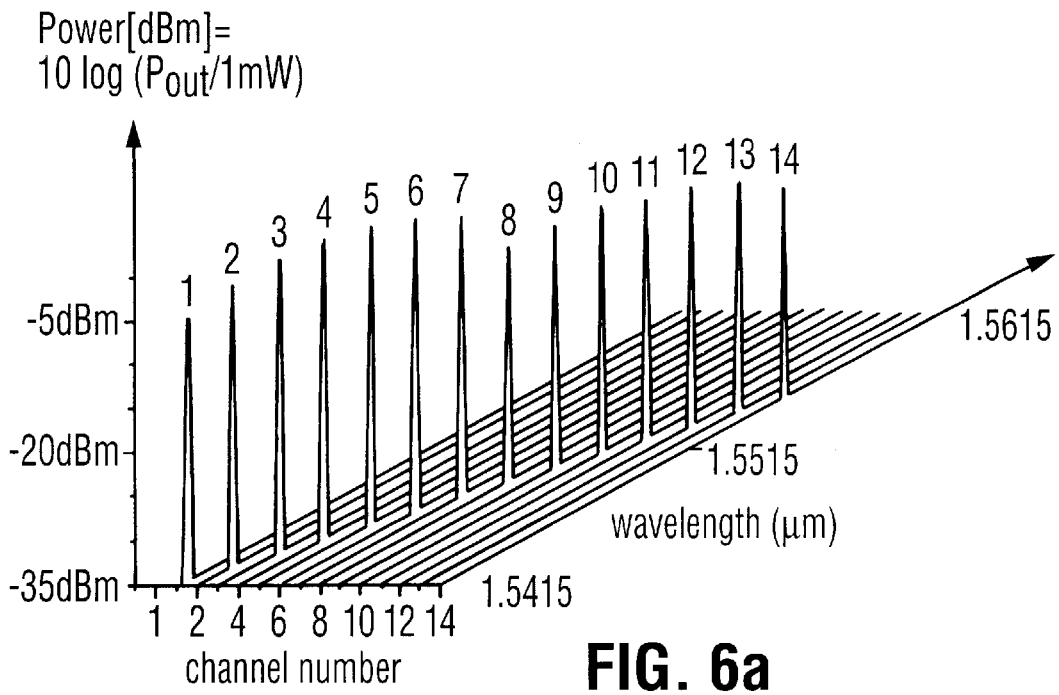
FIG. 6 is an oscillation spectrum of the laser in accordance with the first embodiment of the invention for the current injection into the first section of the laser varying above a threshold level, the second section of the laser being unbiased.
Figure 6B:
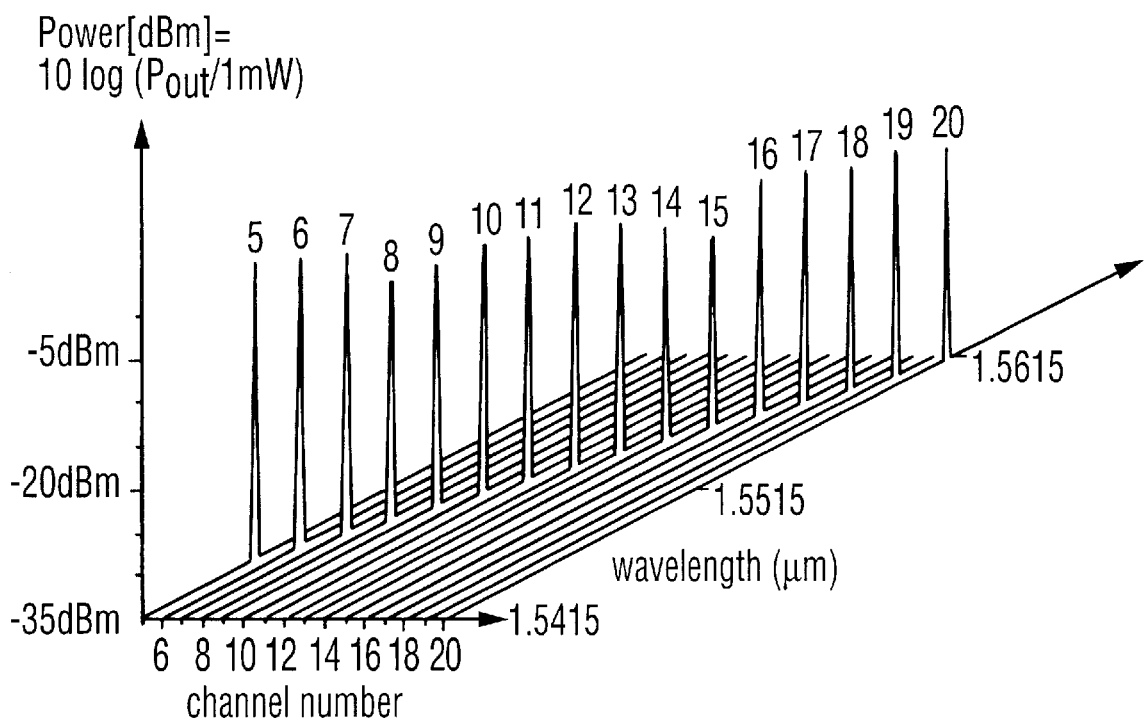

A master and slave type of current injection method is proposed and demonstrated in this embodiment. In a first step, only the first section 26 of the two section DFB laser 10 is biased above the threshold level while the second section 28 is left unpumped or biased in reverse. Although there may be some small current leakage from the first section 26 to the adjacent part of the second section 28, the small leakage current is not able to pump the second section above material transparency level. Therefore the second section 28 behaves mainly like an anti-phase loss coupled structure, which favors in lasing at the left Bragg mode as discussed above. Equivalently, the left Bragg mode from the first section 26 experiences less mirror loss than the right Bragg mode, and lases as the dominant mode. When the bias current is increased, the wavelength can be tuned to longer wavelength by heating effect. As a result, the DFB laser 10 primarily behaves as a standard loss coupled DFB laser with a very high single mode yield, very stable single mode operation and excellent side mode suppression ratio (SMSR). The oscillation spectrum of the laser according to the first embodiment of the invention is shown in FIG. 6 for the first section injection current varying from 40 to 160 mA with a 20 mA step above the threshold level, the second section being unbiased, and the temperature maintained at 20 C. It is seen from FIG. 6 that the left Bragg mode lases with an excellent SMSR over the usually obtainable current or temperature tuning range. In this first step of the tuning operation, the first section 26 of the DFB laser serves as the master laser to provide lasing action, while the second section 28 of DFB laser serves only as a slave to provide a strong wavelength selection mechanism for the preferred left Bragg mode through a loss coupled filtering mechanism. Since only the first section 26 is biased, the laser properties are very similar to a single contact loss coupled DFB laser. That is why an excellent SMSR (over 45 dB, see FIG. 9) ratio is obtained without suffering from mode competition which takes place in conventional multi-section DFB lasers.

Figure 7:
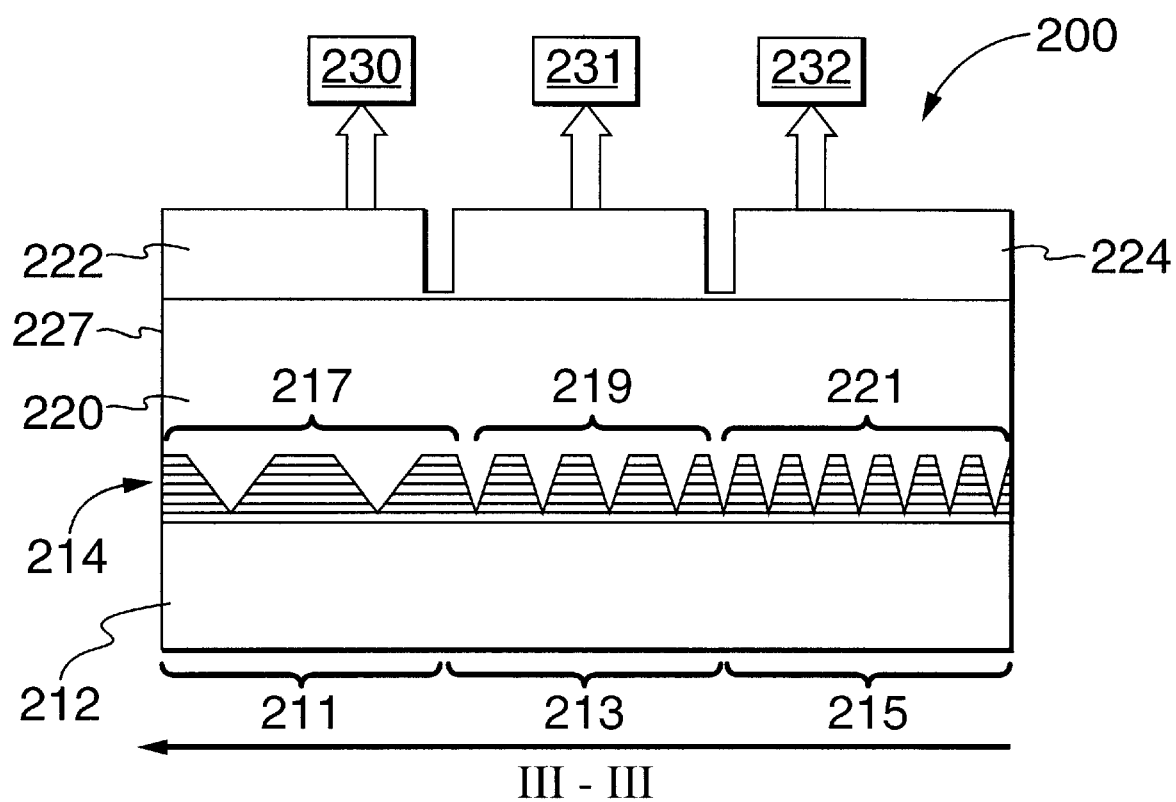
FIG. 7 is an oscillation spectrum of the laser in accordance with the first embodiment of the invention for the current injection into the first section of the laser being fixed below threshold and above a transparency level, and current injection into the second section of the being varied above a threshold level.

The tuning range for one single contact DFB laser is limited by the possible applied current and temperature. In order to enhance the wavelength tuning range in the DFB laser of the present invention, a second step of laser operation is performed. The current injection into the first section of the laser is reduced to a level necessary to maintain the first section 26 above a transparency level only. The purpose of this arrangement is to provide a transparent optical path for the light generated from the second section 28 of the laser. The second section is then biased above the threshold level, and the injection current of second section 28 is increased from values above the threshold level to higher values for wavelength tuning. Now since both sections are biased above the material transparency level, there is no lossy part in the entire two-section DFB laser cavity. Both sections now favor in lasing at the right Bragg mode due to in-phase gain coupling mechanism, the lasing mode of two-section DFB laser being predominantly on the longer wavelength side of the stop band. In this second step of tuning operation, the first section 26 of the DFB laser serves only as slave to provide a transparent path for the light passing through, while the second section 28 of the DFB laser serves as a master laser whose lasing wavelength is tuned by current or temperature change. The corresponding oscillation spectrum is shown in FIG. 7 for the injection current into the first section being fixed below threshold and above a transparency level, the current injection into the second section being varied above the threshold level. On the plot in FIG. 7 the injection current into the first section is set at 10 mA all the time, while the current injection into the second section is increased from 40 to 160 mA with an interval of 20 mA, the temperature being maintained at 20 C.

The combined wavelength tuning characteristics for the two-section complex coupled DFB laser according to the first embodiment of the invention are shown in FIG. 8, where tuning of both injection currents into the first and second sections of the laser produce two corresponding tuning subregions 66 and 68. Two tunable subregions 66 and 68 are joined together by the stop band of the DFB laser.

The SMSR for the entire wavelength tuning range is shown in FIG. 9. Excellent SMSR over 45 dB is obtained in both steps of tuning operation. Plots 70 and 72 correspond to the tuning of current injection into the first and the second sections of the laser respectively.

Thus, in the first step of the operation, the laser starts lasing on the left Bragg mode when the injection current is low, and is gradually tuned to a longer wavelength. Normally several nanometers wavelength tuning range can be achieved by current and temperature tuning (7 nm in our experiments, as follows from the plot in FIG. 6). In the second step of the tuning operation, the laser starts lasing on the right Bragg mode, which wavelength is usually by several nanometers longer than that one of the left Bragg mode. The separation between Bragg modes is determined by the coupling strength of the DFB laser, and can be easily changed by the etching depth, grating region material composition, and laser cavity length. Based on these two steps of master and slave type of tuning operation, the composite two-section complex coupled DFB laser exhibits enhanced wavelength tuning range, composing of two wavelength tuning subregions, which normally sit side by side with some small overlap. The overlap can also be easily changed by the DFB structure and grating structure design. Therefore, the two step master and slave method of laser operation enhances a tuning range in the DFB laser, providing continuous wavelength tuning across the entire tuning range with an excellent single mode performance comparable to any stand along complex coupled DFB laser.

Principles of operation of the DFB semiconductor laser according to another embodiments of the invention remain similar to that one described above. For pumping the active region of the DFB laser by coupling to an external optical source, the master and slave type of pumping control for controllably activating a left Bragg mode or a right Bragg mode across the laser stop band comprises the following similar steps. At a first step of laser operation, the first section of the laser is pumped above the threshold level, the second section of the laser being unpumped or pumped below a transparency level. It provides a loss coupling mechanism of laser operation, resulting in laser oscillation at the left Bragg mode. At a second step of master and slave method of operation a laser, the first section of the laser is pumped above a transparency level, and the second section is pumped above a threshold level, the right Bragg mode being activated, and a gain coupling mechanism of laser operation being provided. The laser wavelength is tuned around the corresponding Bragg mode, when the mode is activated, providing extended tuning range.

Master and slave type of laser operation control also provides fast wavelength switching between two Bragg modes. Due to reliable selection of the corresponding Bragg mode by master and slave type of current-setting, fast switching of the controlling current pulse (usually within a time interval of several nanoseconds) provides fast switching between the Bragg modes, the SMSR being maintained high. Additionally, push pull current setting and periodic modulation of the left Bragg mode and the right Bragg mode, when the corresponding mode is activated, allow to form a DFB laser with two wavelength modulation. Both wavelengths are modulated at the same time by the driving signal, but with on and off status reversed. Two wavelengths are then separated by optical filters and fed into different channels of processing equipment.

One of the most important applications of widely tunable DFB lasers is dense wavelength division multiplexing systems. In order to test a performance of such a system, comprising two-section complex coupled DFB laser 10, light from the laser is directly coupled into a III–V Mach-Zender (MZ) modulator (not shown) without the use of an isolator. The MZ provides modulation at 2.488 Gb/s, and light coming out from the end of the MZ is then coupled into an optical isolator. Modulated light is transmitted through 375 km of normal nondispersion shifted fiber with an extinction 18:1. FIG. 10 shows the bit error rate plot (BER) as function of the received optical power for distances 0 km and 375 km (plots 74 and 76 correspondingly). No degradation is observed within the entire tuning range due to the excellent SMSR achieved during the wavelength tuning.

Fabricating

Fabricating of the DFB semiconductor laser device 10 according to the first embodiment shown in FIG. 1, proceeds in four stages as follows:

1. first epitaxial growth of substrate and multiple quantum well structure;
2. patterning of the grating structure;
3. second epitaxial growth of the overlying layers;
4. completion of the laser fabricating (e.g. ridge formation, contacts).

The prepared substrate 12 is loaded promptly into a commercially available CVD growth chamber, and a buffer layer 14 of InP followed by the first confinement region 35, including four layers of InGaAsP, is grown. The active region 14, comprising eight 1% compressively strained P-doped InGaAsP quantum wells 44, separated by seven P-doped InGaAsP unstrained barriers 46, is grown next.

The wafer is then removed from the growth chamber and processed so as to form photolithographically a grating structure 18 by periodically etched grooves through the active region 14. First, a dielectric such a $SiO_2$ (not shown) is grown on the surface of the wafer, and the groove pattern is created in the dielectric layer. The grooves are etched using reactive ion etching or wet chemical etching process. The residual dielectric is then removed. Using known crystal growth techniques, for example, a metal oxide chemical vapor deposition, an InP layer 52 is grown in the grooves. Etch stop layer 54 of InGaAsP grown between two buffer layers 56 and 58 of InP, followed by cladding layer 60 of InP and capping layer 62 of InGaAs complete the structure. Laser fabricating is then completed using a standard process. For example, to form a rectangular ridge waveguides 22 and 24 perpendicular to the grooves of the grating structure 18, a ridge mask is provided on the substrate, and the ridges are formed by etching through the capping layer 62 and top cladding layer 60, the ridges being 2 µm nominal width. The split top electrodes 30 and 32 are defined by the mask used in the metalization step and created in the lift-off process. The front facet of the composite complex coupled DFB laser is AR-coated (anti-reflection coated). The back facet may be AR-coated or as-cleaved for DFB laser with a large stop band width, or HR-coated (high-reflection coated) for efficient DFB laser with a small stop band width. Alternatively, after the second regrowth, when a current confining region is formed on the active region, a buried heterostructure may also be grown. For the second embodiment of the laser device shown in FIG. 4, comprising two grating sections, having different corrugation periods, a phase mask generated by Electron Beam (EB) lithography or the direct EB writing on wafer may be used as an alternative to a wet etching process. The grating structure may also be formed in the layer adjacent to the active region by a holographic exposure technique.

Thus, beneficially the structure disclosed herein is made by two step metal organic chemical vapor deposition growth and ridge waveguide processing step, and provides a significantly enhanced continuous wavelength tuning range while maintaining the excellent dynamic single mode operation inherent for the complex coupled DFB laser.

Thus, it will be appreciated that, while specific embodiments of the invention are described in detail above, numerous variations and modifications of these embodiments fall within the scope of the invention as defined in the following claims.

What is claimed is:

1. A distributed feedback single mode complex coupled semiconductor laser device, comprising:
   a) a substrate;
   b) an active region formed thereon;
   c) a complex-coupled grating structure having corrugations along a cavity length direction;
   d) a first and a second excitation means for an independent pumping first and second sections of the laser axially distinct along a cavity length direction;
   the laser device being characterized by means for varying the pumping of the first section of the laser with respect to the pumping of the second section of the laser in a master and slave type of pumping control for controllably activating a left Bragg mode or a right Bragg mode across the laser stop band by alternating use of anti-phase loss coupling or in-phase gain coupling mechanisms of laser operation.

2. A laser device of claim 1, further comprising means for tuning the laser wavelength around the left Bragg mode and the right Bragg mode correspondingly.

3. A laser device of claim 1, wherein the left Bragg mode is activated and the loss coupling mechanism of laser operation is provided by pumping the first section of the laser above a threshold level, the second section of the laser being unpumped or pumped in reverse or below a transparency level.

4. A laser device of claim 1, wherein the right Bragg mode is activated and the gain-coupling mechanism of laser operation is performed by pumping the first section of the laser above a transparency level and the second section above a threshold level.

5. A laser device of claim 1, wherein the active region comprises a multiple quantum well structure.

6. A laser device of claim 1, wherein the excitation means comprises an external optical pumping source.

7. A laser device of claim 1, wherein the excitation means comprises electrical contacts for current injection into the active region.

8. A laser device of claim 1, wherein a current confining region is formed on the active region.

9. A laser device of claim 8, wherein the excitation means comprises a first and a second electrodes formed on a top of the current confining region.

10. A laser device of claim 8, wherein the current confining region is a ridge waveguide.

11. A laser device of claim 8, wherein the current confining region is a buried heterostructure-structure.

12. A laser device of claim 1, wherein the grating structure is a chirped grating or a uniform grating.

13. A laser device of claim 1, wherein the grating structure comprises periodic etched grooves through the active region.

14. A laser device of claim 1, wherein the grating structure comprises a first grating section and a second grating section positionally corresponding to the first and the second sections of the laser.

15. A laser device of claim 14, wherein the first and the second grating sections have the same corrugation period.

16. A laser device of claim 14, wherein the first and the second grating sections have different corrugation periods.

17. A laser devices of claim 14, wherein the corrugation periods of the first and the second grating sections differ so that to provide a center Bragg wavelength separation of the grating sections within a range of several nanometers to several tens of nanometers.

18. A distributed feedback single mode complex coupled semiconductor laser device, comprising:
   a) a substrate;
   b) a bottom electrode formed on a bottom surface of the substrate;
   c) an active region formed on the substrate, comprising a multiple quantum well structure;
   d) a complex coupling grating formed by periodic etching grooves through the active region along a cavity length direction;
   e) a current confining ridge on the active region, and
   f) a first electrode and a second electrode, formed on a top of the current confining ridge for independent current injection into a first section and a second section of the laser axially distinct along a cavity length direction,
   the laser device being characterized by means for varying the current injection through the first electrode with respect to the current injection through the second electrode in a master and slave type of current injection control for controllably activating a left Bragg mode or right Bragg mode across the laser stop band by alternating use of anti-phase loss coupling or in-phase gain coupling mechanisms of laser operation, and tuning the lasing wavelength around the left Bragg mode and the right Bragg mode by varying the correspondent current injection.

19. A laser device of claim 18, wherein the left Bragg mode is activated by biasing the first section of the laser above a threshold level, the second section of the laser being unbiased, biased in reverse or below a transparency level, the loss coupling mechanism of laser operation being provided.

20. A laser device of claim 18, wherein the right Bragg mode is activated by biasing the first section of the laser above a transparency level and the second section above a threshold level, the gain coupling mechanism of laser operation being provided.

21. A laser device of claim 18, wherein a depth of the grooves of the grating structure is equal to a thickness of the active region.

22. A laser device of claim 18, wherein a depth of the grooves of the grating structure is less than a thickness of the active region.

23. A laser device of claim 18, wherein the grating is a first order grating.

24. A laser device of claim 18, wherein the grating is a chirped grating.

25. A laser device of claim 18, wherein a side-mode suppression ratio of the Bragg modes over 45 dB is achieved.

26. A laser device of claim 18, wherein the substrate is of N-type and the current confining ridge is of P-type.

27. A laser device of claim 18, wherein the substrate is of P-type and the current confining ridge is of N-type.

28. A laser device of claim 18, wherein the substrate is made of InP.

29. A laser device of claim 28, wherein a wavelength of generated light is within a range of 1.3–1.56 μm.

30. A laser device of claim 18, wherein the substrate is made of GaAs.

31. A laser device of claim 30, wherein a wavelength of generated light is within a range of 0.8–0.9 μm.

32. A method of operating a distributed feedback complex coupled semiconductor laser device, having a first section and a second section of the laser axially distinct along a cavity length direction, and a first excitation means and a second excitation means for an independent pumping of the corresponding section of the laser, the method comprising:

varying the pumping of the first section of the laser with respect to the pumping of the second section of the laser in a master and slave type of pumping control for controllably activating a left Bragg mode or a right Bragg mode across the laser stop band by alternating use of anti-phase loss coupling or in-phase gain coupling mechanisms of laser operation.

33. A method of claim 32, comprising an additional step of tuning the laser wavelength around the left and the right Bragg modes correspondingly.

34. A method of claim 32, wherein the step of varying the pumping in the master and slave type of pumping control comprises pumping the first section of the laser above a threshold level, the second section of the laser being unpumped or pumped below a transparency level, the left Bragg mode being activated and the loss coupling mechanism of laser operation being provided.

35. A method of claim 32, wherein the step of varying the pumping in the master and slave type of pumping control comprises pumping the first section of the laser above a transparency level and the second section above a threshold level, the right Bragg mode being activated and the gain coupling mechanism of laser operation being provided.

36. A method of claim 32, wherein the step of varying the pumping comprises fast wavelength switching between the left Bragg mode and the right Bragg mode within a time interval of several nanoseconds.

37. A method of claim 32, wherein the step of varying the pumping comprises periodic fast wavelength switching between the left Bragg mode and the right Bragg mode within a time interval of several nanoseconds, the method further comprising the steps of:

periodic modulation of the left Bragg mode and the right Bragg mode when the corresponding mode is activated;

separation of left and right Bragg modes by optical filtering techniques.

38. A method of enhancing a tuning range in a distributed feedback complex coupled semiconductor laser device, having a first section and a second section of the laser axially distinct along a cavity length direction, and a first electrode and a second electrode for an independent current injection into the corresponding section of the laser, the method comprising:

varying the current injection through the first electrode with respect to the current injection through the second electrode in a master and slave type of current injection control for controllably activating a left Bragg mode or a right Bragg mode across the laser stop band by alternating use of anti-phase loss coupling or in-phase gain coupling mechanisms of laser operation; and tuning the laser wavelength around the left and the right Bragg modes by varying the corresponding current injection.

39. A method of claim 38, wherein the step of varying the current injection in a master and slave type of injection control comprises biasing the first section of the laser above a threshold level, the second section of the laser being unbiased, biased in reverse or below a transparency level, the left Bragg mode being activated and the loss coupling mechanism of laser operation being provided.

40. A method of claim 38, wherein the step of varying the current injection in a master and slave type of injection control comprises biasing the first section of the laser above a transparency level and the second section above a threshold level, the right Bragg mode being activated and the gain coupling mechanism of laser operation being provided.

41. A method of fabricating a distributed feedback single mode complex coupled semiconductor laser device, comprising:

a) providing a substrate;

b) forming an active region thereon;

c) forming a complex coupled grating structure having corrugations along a cavity length direction;

d) providing a first excitation means and a second excitation means for an independent pumping of a first section and a second section of the laser axially distinct along a cavity length direction;

e) providing means for varying pumping of the first section of the laser with respect to the pumping of the second section of the laser in a master and slave type of control for controllably activating a left Bragg mode or a right Bragg mode across the laser stop band by alternating use of anti-phase loss coupling or in-phase gain coupling mechanisms of laser operation;

f) providing means for tuning the laser wavelength around the left and the right Bragg modes correspondingly.

42. A method of fabricating a distributed feedback single mode complex coupled semiconductor laser device, comprising:

a) providing a semiconductor substrate;

b) forming a bottom electrode on a bottom surface of the substrate;

c) forming an active region on the substrate comprising a multiple quantum well structure;

d) forming a complex coupled grating formed by periodic etching grooves through said active region along a cavity length direction;

e) forming a current confining ridge on the active region;

f) forming a first electrode and a second electrode on a top of the current confining ridge for an independent current injection into a first section and a second section of the laser axially distinct along a cavity length direction;

g) providing means for varying the current injection through the first electrode with respect to the current injection through the second electrode in a master and slave type of current injection control for controllably activating a left Bragg mode or a right Bragg mode across the laser stop band by alternating use of anti-phase loss coupling or in-phase gain coupling mechanisms of laser operation;

h) providing means for tuning the laser wavelength around the left Bragg mode and the right Bragg mode correspondingly.

* * * * *